US005438679A

United States Patent [19]

Inomata et al.

[11] Patent Number: 5,438,679

[45] Date of Patent: Aug. 1, 1995

[54] DATA STORAGE APPARATUS HAVING VOLATILE MEMORY AND NONVOLATILE MEMORY AND DATA INDICATION MEANS FOR INDICATING MEMORY STORING DATA

[75] Inventors: Shinichi Inomata, Higashiyamato; Eiji Nakazawa, Akishima; Hisashi Miyata, Mitaka; Toru Magihira, Hamura, all of Japan

[73] Assignee: Casio Computer Co., Ltd., Tokyo, Japan

[21] Appl. No.: 796,549

[22] Filed: Nov. 21, 1991

[30] Foreign Application Priority Data

| | | | |
|---|---|---|---|
| Nov. 30, 1990 | [JP] | Japan | 2-334526 |
| Nov. 30, 1990 | [JP] | Japan | 2-334528 |
| Dec. 13, 1990 | [JP] | Japan | 2-402066 |
| Dec. 27, 1990 | [JP] | Japan | 2-402496 U |
| Dec. 27, 1990 | [JP] | Japan | 2-402497 U |

[51] Int. Cl.$^6$ ........................ G06F 9/24; G06F 9/445; G06F 12/06; G06F 12/14

[52] U.S. Cl. ................................ 395/800; 364/229.5; 364/231.1; 364/231.3; 364/231.5; 364/238.4; 364/238.6; 364/242.33; 364/243.44; 364/243; 364/243.7; 364/245.2; 364/246; 364/246.11; 364/246.5; 364/DIG. 1; 364/DIG. 2

[58] Field of Search ............... 395/800, 400, 425, 200, 395/325, 650, 575, 500, 550, 700, 725, 750, 775, 250, 275; 364/569, 550, DIG. 1, DIG. 2; 368/9, 10

[56] References Cited

U.S. PATENT DOCUMENTS

| | | | |
|---|---|---|---|
| 4,493,043 | 1/1985 | Forbath | 364/569 |
| 4,564,922 | 1/1986 | Muller | 395/425 |
| 4,652,139 | 3/1987 | Sulcer, Jr. | 368/9 |
| 4,712,923 | 12/1987 | Martin | 368/10 |
| 4,874,935 | 10/1989 | Younger | 235/492 |
| 4,907,795 | 3/1990 | Shaw et al. | 482/9 |
| 5,181,231 | 1/1993 | Parikh et al. | 377/26 |
| 5,231,592 | 7/1993 | Itoh | 364/550 |

FOREIGN PATENT DOCUMENTS

| | | |
|---|---|---|
| 0213588 | 3/1987 | European Pat. Off. . |
| 0340981 | 11/1989 | European Pat. Off. . |

OTHER PUBLICATIONS

Patent Abstracts of Japan, vol. 8, No. 10 (P-248)(1447) Jan. 18, 1984 & JP-A-58 169 395 (Fujitsu) Oct. 5, 1983.

Patent Abstracts of Japan, vol. 14, No. 382 Aug. 17, 1990 & JP-A-21 40 151 (Toshiba).

*Primary Examiner*—Alyssa H. Bowler
*Assistant Examiner*—Daniel H. Pan
*Attorney, Agent, or Firm*—Frishauf, Holtz, Goodman & Woodward

[57] ABSTRACT

Data input from a key switch is displayed on a liquid crystal display, and whether to store the data in a RAM or an EEPROM is selected by a selection switch. If the EEPROM is selected, a CPU turns on a power switch to apply a high voltage to the EEPROM to write the input data therein. Data stored in the RAM and the EEPROM are read out upon operation of a search switch and are sequentially displayed on the liquid crystal display. It is clearly indicated on the display whether the currently displayed data is read out from the RAM or the EEPROM. With this operation, if data which is required to be protected against disconnection of a power supply voltage or a drop in power supply voltage is stored in the RAM, the data can be stored in the EEPROM.

28 Claims, 15 Drawing Sheets

|   | DISPLAY REGISTER | | | |
|---|---|---|---|---|
| | M \| F \| G | TIMEPIECE REGISTER | | |
| | P0 | P1 | S | |
| C0 — | AKAO | 33-4567 | 1 | 0 — CT |
| C1 — | ENDO | 0521-21-1123 | 3 | 0 |
| | CX | CY | CZ | |
| Cn — | | | | |

| | Dx | Dy | N0 |
|---|---|---|---|
| D0 — | | | |
| D1 — | | | N1 |
| D2 — | | | N2 |

DATA STORAGE APPARATUS HAVING VOLATILE MEMORY AND NONVOLATILE MEMORY AND DATA INDICATION MEANS FOR INDICATING MEMORY STORING DATA

BACKGROUND OF THE INVENTION

1. Field of the Invention

The present invention relates to a data storage apparatus including both a volatile memory, in which stored data is lost when the power supply voltage is lowered or cut off, and a nonvolatile memory in which storage data is preserved when the power supply voltage is lowered or cut off.

2. Description of the Related Art

In an electronic device designed to store input data, a volatile memory such as a RAM is used as a memory for storing the data. In a volatile memory, stored data is lost when the power supply voltage is lowered or cut off. For this reason, in some devices, a nonvolatile memory such as an EEPROM is used in place of a RAM.

A nonvolatile memory such as an EEPROM, however, has various drawbacks, e.g., a small memory capacity, a limited data write count, and a high voltage for a data write operation leading to large current consumption. Under the circumstances, it is difficult to replace RAMs with EEPROMs at once.

More specifically, in an apparatus in which data are frequently written in a memory, if an EEPROM is used as the memory, and the data write count limit is exceeded, the apparatus itself cannot be used unless the EEPROM is replaced with a new one. In addition, if a battery or the like is used as a power supply, since a data write operation must be performed with a high voltage, the service life of the battery is shortened.

SUMMARY OF THE INVENTION

It is an object of the present invention to provide a data storage apparatus which can preserve only necessary data of stored data even if the power supply voltage is lowered or cut off.

It is another object of the present invention to provide a data storage apparatus which can preserve only necessary data by using an EEPROM even if the power supply voltage is lowered or cut off, and is designed so as not to exceed the data write count limit or shorten the service life of a battery.

In order to achieve the above objects, according to the present invention, there is provided a data storage apparatus comprising: data input device for inputting data; a volatile memory capable of storing the data input by said data input device; nonvolatile memory capable of storing the data input by said data input device; a selection switch for selecting one of said volatile memory and said nonvolatile memory in which the data input by said data input device is stored; a storage controller for causing the memory selected by said selection switch to store the data input by said data input; and a display device for reading out the data stored in said volatile and nonvolatile memory means.

With such an arrangement, according to the present invention, data to be preserved can be reliably preserved even if the power supply voltage is lowered or cut off. In addition, a data write count can be minimized, and the power consumption can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 14 show the first embodiment of the present invention, in which:

FIG. 1 is a perspective view of an electronic wristwatch according to the present invention, FIG. 2 is a perspective view showing a display portion of the electronic wristwatch, FIG. 3 is a block diagram showing the circuit arrangement of the electronic wristwatch FIG. 4 is a view showing the memory architecture of a RAM 6 in FIG. 3, FIG. 5 is a view showing the memory architecture of EEPROM 7 in FIG. 3, FIGS. 6 to are flow charts respectively showing sequences of operations, and FIG. 11 is a block diagram showing changes in display mode, based on switching operations;

FIG. 12 is a view showing changes in display during a data setting operation;

FIG. 13 is a view showing changes in display during a data sequential search;

FIG. 14 is a view showing a display state during a data transfer operation;

FIGS. 17 to 21 show the third embodiment of the present invention, in which:

FIG. 17 is a view showing the memory architecture of a RAM,

FIG. 18 is a view showing the memory architecture of an EEPROM,

FIG. 19 is a flow chart showing a sequence of operations, and

FIGS. 26 and 21 are views respectively showing display states.

DETAILED DESCRIPTION OF THE PREFERRED EMBODIMENTS

[First Embodiment]

An embodiment of the present invention will be described below with reference to FIGS. 1 to 14. In this embodiment, a data storage apparatus of the present invention is applied to an electronic wristwatch.

Figure 1:
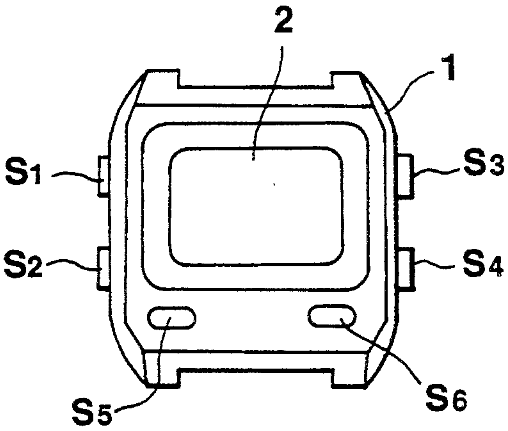

FIG. 1 is a perspective view of an electronic wristwatch to which the present invention is applied. An LCD (liquid crystal display) 2 and an $S_1$ key to an $S_6$ key constituted by push-button switches are arranged on an electronic wristwatch main body 1. The $S_1$ key serves to switch a current time display mode and a data display mode, which will be described later. The $S_2$ key serves to switch a data display state in which stored data is displayed, and a set data display state in which data is input, and is also used to perform data editing, as will be described later. The $S_3$ key serves to perform a sequential search operation in which stored data are sequentially displayed on the LCD 2. The $S_4$ key serves to perform data transfer processing and is also used to select a character when data correction is performed. The $S_5$ key serves to select a digit position when data correction is performed. The $S_6$ key is used to perform other processing.

Figure 2:
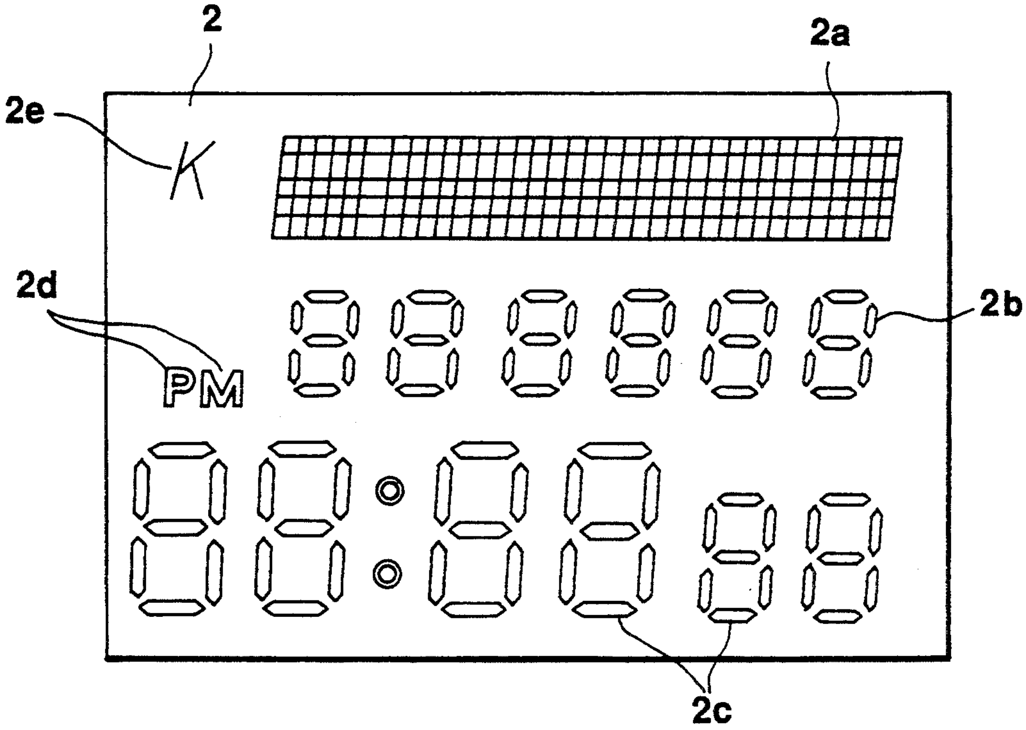

FIG. 2 shows the arrangement of the LCD 2. The LCD 2 comprises a dot matrix display portion *2a* for displaying characters, numeric segment display portions *2b* and *2c* for displaying numerals, a PM symbol display portion *2d*, and a "keep" mark display portion (K display portion) *2e*. The dot matrix display portion *2a* displays name data included in name/telephone-number data. The numeric segment display portions *2b* and *2c* display time data or telephone number data included in name/telephone-number data. The "keep" mark display portion (K) *2e* indicates that name/telephone-number data displayed on the dot matrix display portion *2a* and the numeric segment display portions *2b* and *2c* is kept in an EEPROM 7 (to be described later).

Figure 3:
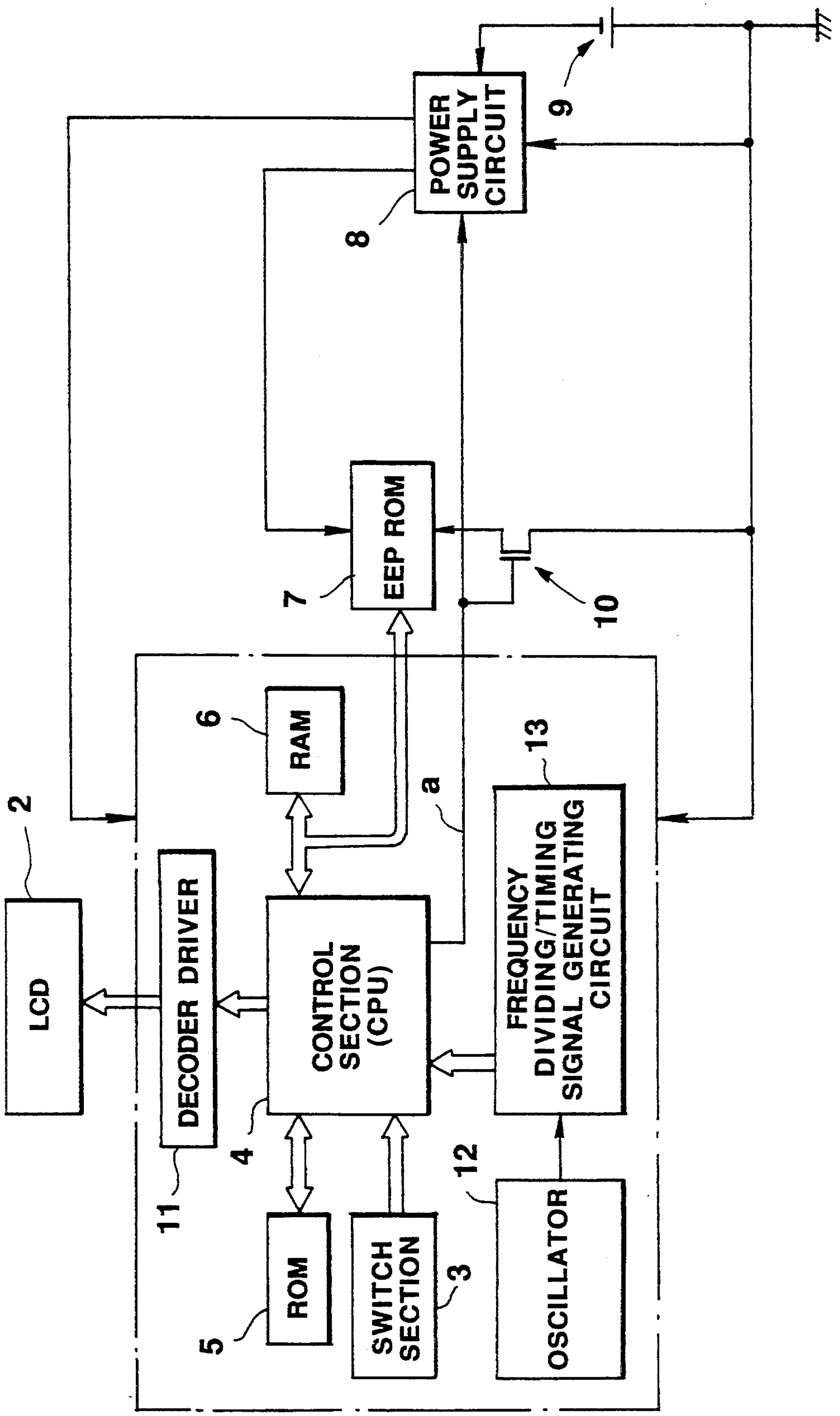

FIG. 3 is a block diagram showing the circuit arrangement of the electronic wristwatch. Referring to FIG. 3, a switch section 3 includes the $S_1$ key to the $S_6$ key shown in FIG. 1, and serves to output a key input signal corresponding to a key input to a control section (CPU) 4. The control section 4 is a central processing section for performing various types of processing in accordance with microprograms stored in a ROM 5 in advance. A RAM 6 is a volatile memory for storing various data such as name/telephone-number data and current time data. The EEPROM (electrically erasable and programmable read only memory) 7 as a nonvolatile memory capable of rewrite operation serves to store arbitrarily selected name/telephone-number data. A power supply circuit 8 applies a driving voltage (1.5 V) to the respective components in accordance with a voltage (3 v) applied from a lithium battery 9, and also supplies a predetermined voltage (2 V) to the EEPROM 7 in response to a signal a output from the control section 4. AMOS transistor 10 is a gate element for controlling the supply of power to the EEPROM 7. In response to the signal a output from the control section 4, the MOS transistor 10 is turned on to connect the EEPROM 7 to the ground voltage (GND).

A decoder driver 11 outputs a display driving signal to the LCD 2 in accordance with display data output from the control section 4. An oscillator 12 incorporates a quartz oscillator and outputs, e.g., a 32-kHz (32768) clock pulse to a frequency dividing/timing signal generating circuit 13. The frequency dividing/timing signal generating circuit 13 frequency-divides the clock pulse supplied from the oscillator 12 to generate various types of timing signals such as a timepiece signal. The circuit 13 then outputs the timing signals to the control section 4.

Figure 4:
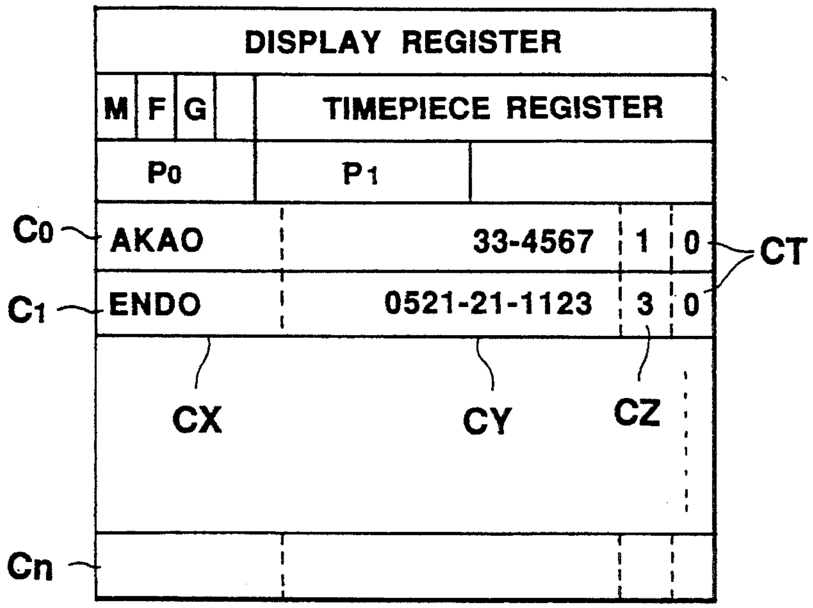

FIG. 4 shows the memory architecture of the RAM 6. As shown in FIG. 4, the RAM 6 includes various types of registers and TEL data memories $C_0$ to $C_n$ for storing name/telephone-number data. A display register is a register for storing data to be displayed on the LCD 2. A mode register M is a register for storing a mode flag. When M=0 (the value of the register M is "0"), the current time display mode is set. When M=1, the data display mode is set. A flag register F stores a flag indicating whether data correction is being performed. A flag register G stores a selection flag indicating whether the RAM 6 or the EEPROM 7 is selected in a data read/write operation. When G=0, the RAM 6 is selected. When G=1, the EEPROM 7 is selected. A timepiece register serves to store the current time (date and time) counted by the control section 4. A register $P_0$ is a pointer for designating an address of each of the TEL data memories $C_0$ to $C_n$. A register $P_1$ is a pointer for designating an address of each of TEL data memories $D_0$, $D_1$, . . . in the EEPROM 7 shown in FIG. 5. In each of the TEL data memories $C_0$ to $C_n$, alphabetic name data is stored in an area CX, telephone number data is stored in an area CY, order data indicating the order of read operations in a sequential search is stored in an area CZ, and a "keep" flag indicating whether data is kept or not is stored in an area CT.

Figure 5:
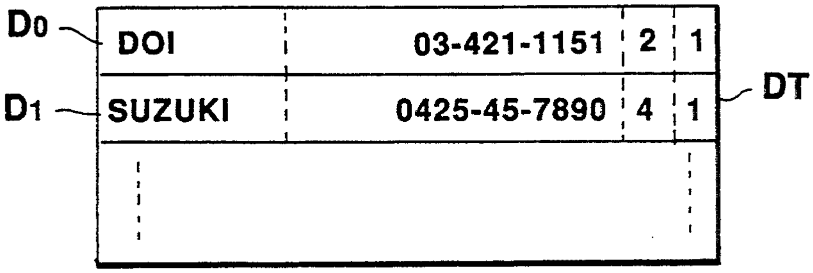

FIG. 5 shows the memory architecture of the EEPROM 7. As shown in FIG. 5, a large number of TEL data memories $D_0$, $D_1$, . . . are arranged in the EEPROM 7. In each of the TEL data memories $D_0$, $D_1$, . . . , alphabetic name data is stored in an area DX, telephone number data is stored in an area DY, order data indicating the order of read operations in a sequential search is stored in an area DZ, and a "keep" flag indicating whether data is kept or not is stored in an area DT.

Figure 7:
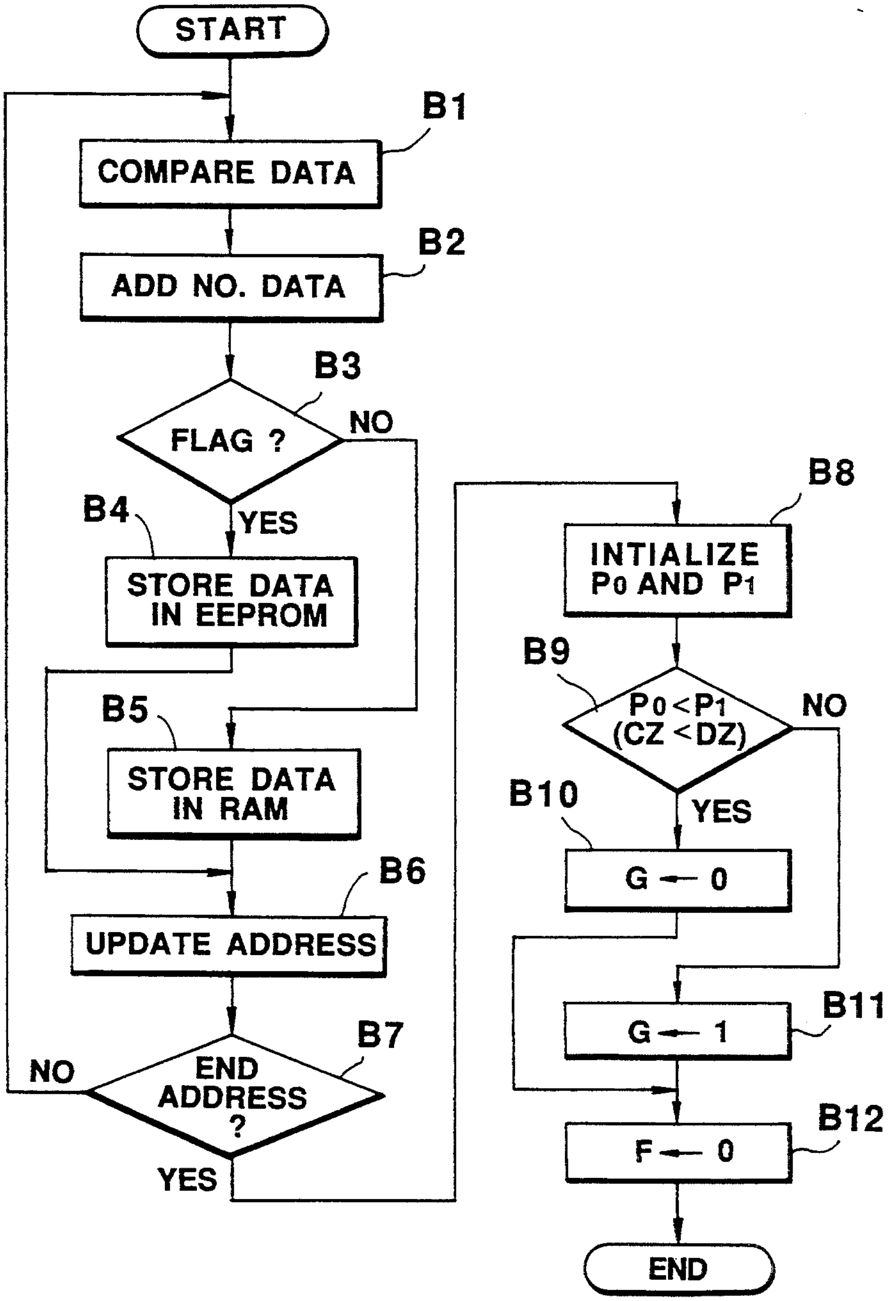
Figure 8:
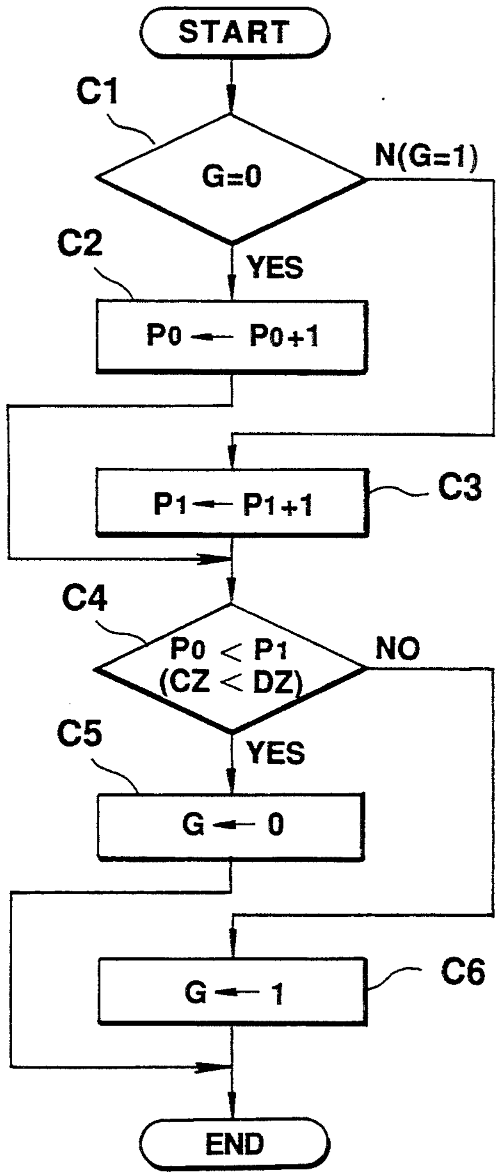
Figure 9:
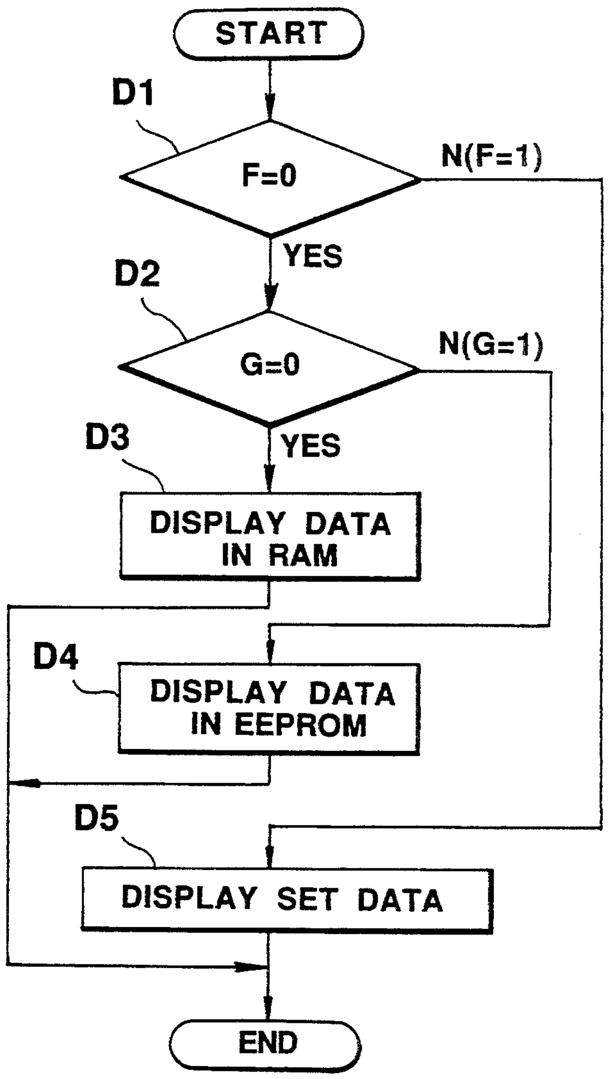
Figure 10:
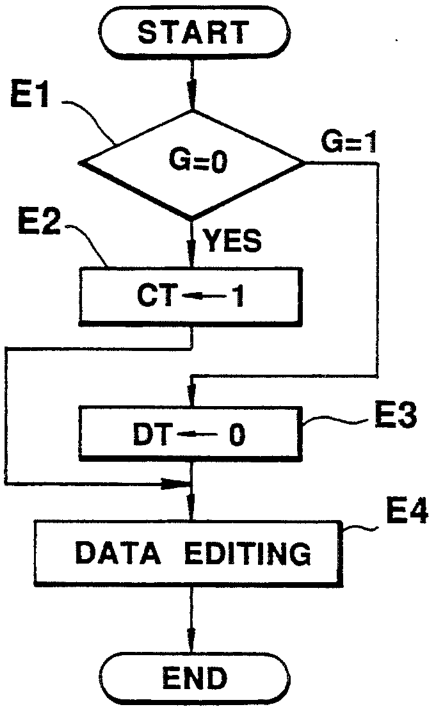
Figure 16:
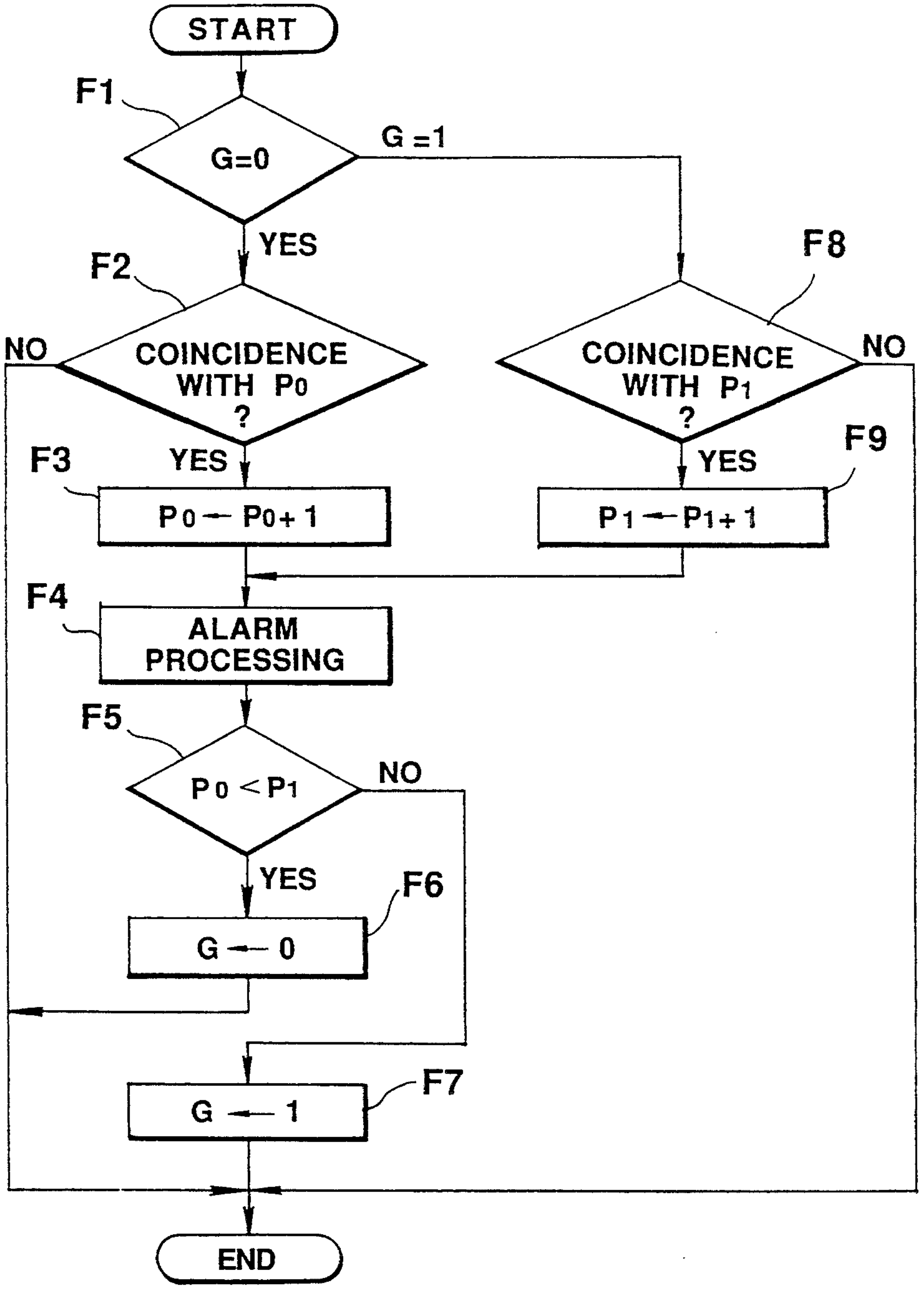

An operation of the apparatus of the above embodiment will be described next with reference to FIGS. 6 to 14. FIG. 16 is a flow chart showing the overall operation. FIG. 7 is a flow chart showing a routine of data editing processing in FIG. 6. FIG. 8 is a flow chart showing a routine of data sequential search processing in FIG. 6. FIG. 9 is a flow chart showing a routine of data display processing in FIG. 6. FIG. 10 is a flow chart showing a routine of data transfer processing in FIG. 6.

The overall operation will be described first with reference to FIG. 6. The control section 4 is kept in a "HALT" state in step A1 until a timepiece signal is out-put from the frequency dividing/timing signal generating circuit 13.

When the timepiece signal is output, the presence of the timepiece signal is determined in step A1, and the flow advances to step A2. In step A2, timepiece processing is performed to update current time data stored in the timepiece register. In step A3, it is checked whether "M=0", i.e., the content of the mode register M is "0". If YES in step A3, the flow advances to step A4 to perform current time display processing.

Figure 11:
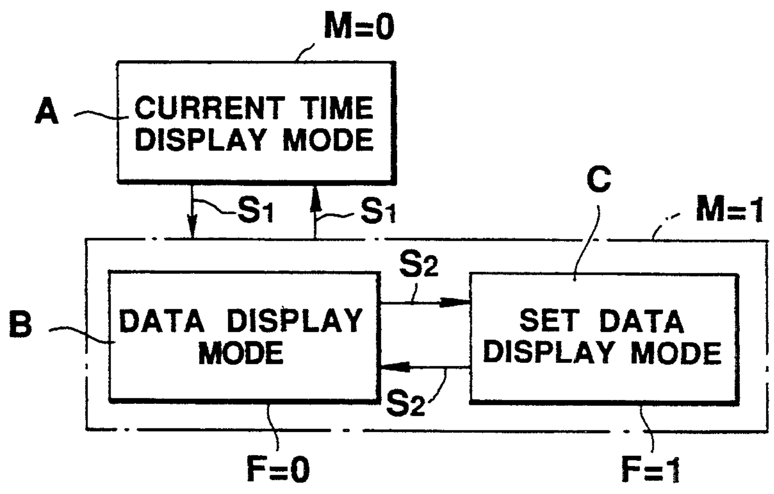

In the current time display processing, the current time data stored in the timepiece register of the RAM 6 is displayed on the LCD 2, as indicated by "A" in FIG. 11. After the processing in step A4 is completed, the flow returns to step A1.

In contrast to this, if "M=1", NO is obtained in step A3, and the flow advances to step A5 to perform data display processing. In step A5, data display processing is performed to display name data and telephone number data on the LCD 2. The flow then returns to step A1. The data display processing will be described in detail later with reference to FIG. 9.

When one of the $S_1$ key to the $S_6$ key is operated, the presence of a key input is determined in step A1, and the flow advances to step A6. In step A6, it is checked whether the operated key is the $S_1$ key. If the $S_1$ key is operated, YES is obtained in step A6, and the flow advances to step A7. In step A7, the content of the mode register M is inverted to switch the modes. For example, if the S1 key is operated when "M=0", "M=1" is set, and the data display mode is set, as indicated by "B" in FIG. 11. If the $S_1$ key is input when "M=1", "M=0" is set, and the current time display mode is set, as indicated by "A" in FIG. 11. After the processing in step A7 is completed, the flow advances to step A3.

If NO in step A6, the flow advances to step A8. In step A8, it is checked whether the operated key is the $S_2$ key. If the $S_2$ key is operated, YES is obtained in step A8, and the flow advance to step A9. In step A9, it is checked whether "M=1", i.e., the content of the mode register M is "1". If YES in step A9, the flow advances to step A10. If NO in step A9, the flow advances to step A20.

If "M=1" in step A9, YES is obtained, and the flow advances to step A10. In step A10, it is checked whether "F=0", i.e., the content of the flag register F is "0". If YES in step A10, the flow advances to step All. If NO in step A10, the flow advances to step A12. If "F=0", YES is obtained in step A10, the flow advances to step A11. In step A11, "1" is written in the flag register F, and "M=1, F=1" is set. As a result, the set data display mode is set, as indicated by "C" in FIG. 11. After the processing in step All is completed, the flow advances to step A3.

If NO (F=1) in step A10, the flow advances to step A12. In step A12, data editing processing is executed, and the flow advances to step A3. The data editing processing will be described in detail later with reference to FIG. 7.

If NO in step A8, the flow advances to step A13. In step A13, it is checked whether the operated key is the $S_3$ key. If the $S_3$ key is operated, YES is obtained in step A13, and the flow advances to step A14. In step A14, it is checked whether "M=1" is set. If YES in step A14, the flow advances to step A15. If NO in step A14, the flow advances to step A20. IF "M=1" is set, i.e., YES is obtained in step A14, and the flow advances to step A15. In step A15, it is checked whether "F=0" is set. If YES in step A15, the flow advances to step A16. If NO in step A15, the flow advances to step A20. If "F=0" is set, YES is obtained in step A15, and the flow advances to step A16 to execute data sequential search processing. The data sequential search processing will be described in detail later with reference to FIG. 8. After the processing in step A16 is completed, the flow advances to step A3.

If NO in step A13, the flow advances to step A17. In step A17, it is checked whether the operated key is the $S_4$ key. If YES in step A17, the flow advances to step A18. If NO in step A17, the flow advances to step A20. If the $S_4$ key is operated, YES is obtained in step A17, and the flow advances to step A18. In step A18, it is checked whether "M=1, F=0" is set. If YES in step A18, the flow advances to step A19. If NO in step A18, the flow advances to step A20. If "M=1, F=0" is set, YES is determined in step A18, and the flow advances to step A19. In the data transfer processing in step A19, displayed data is transferred from the RAM 6 to the EEPROM 7 or from the EEPROM 7 to the RAM 6 and editing processing of the transferred data is performed. The data transfer processing will be described in detail later with reference to FIG. 10. The flow advances from step A19 to step A3.

In step A20, other key input processing is performed. Other key input processing is, for example, current time setting, digit position selection in the data set state in which "M=1, F=1" is set, and data correction processing by character selection. After the processing in step A20 is executed, the flow advances to step A3.

Figure 12:
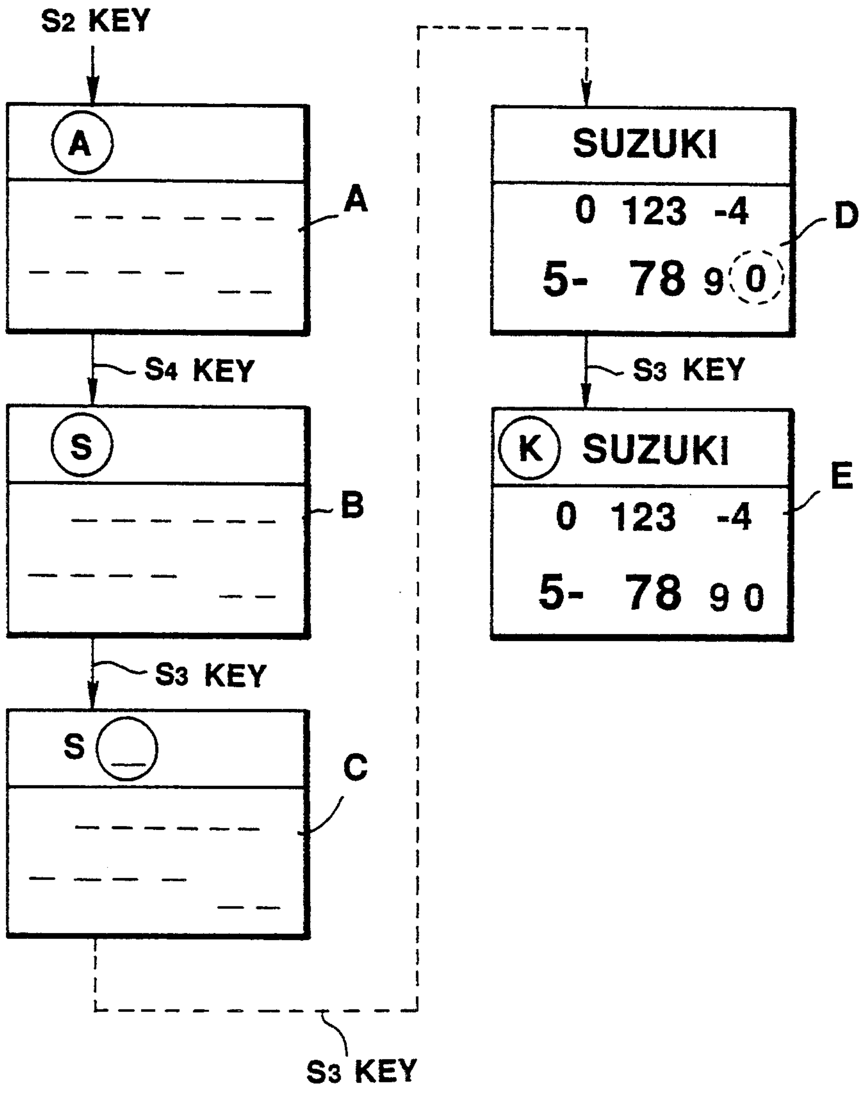
Figure 13:
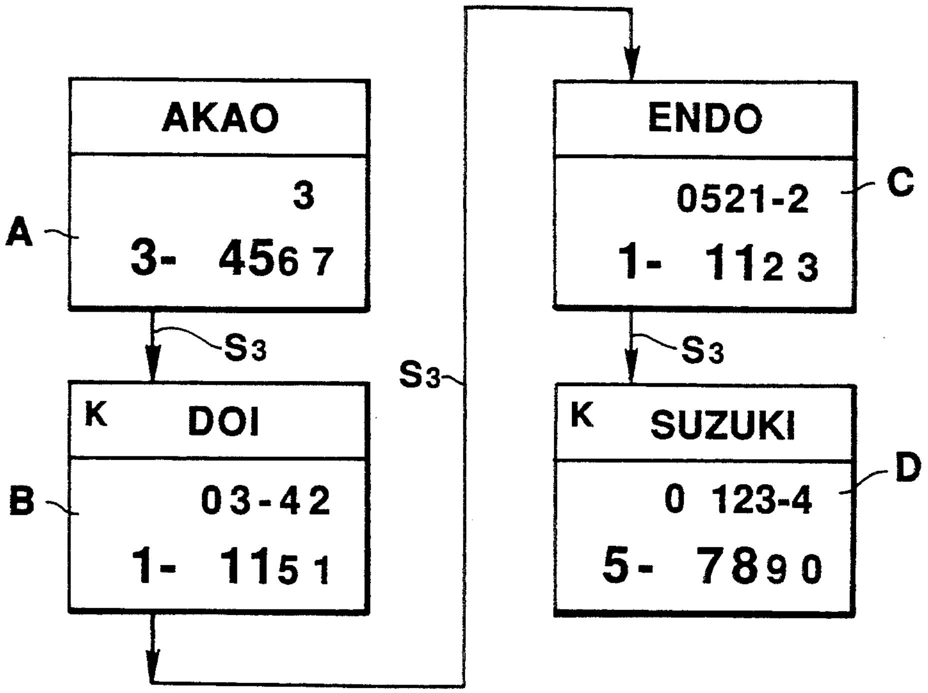

Setting of name/telephone-number data in other key processing in step A20 will be described next with reference to FIG. 12. The $S_1$ key is operated in advance to perform the processing in step A7 so as to set "M=1". In addition, the $S_2$ key is operated to perform the processing in step All so as to set "F=1".

With this operation, the flow advances to step A5 to perform set data display processing in the data display mode, thus flickering the character "A" on the dot matrix display portion *2a* of the LCD 2, as shown in FIG. 12A.

In this case, if the $S_4$ key is sequentially operated, the characters "A", "B", "C", . . . are sequentially selected, and the character "S" is flickered, as shown in FIG. 12B. When the display character "S" is to be set, the $S_3$ key is operated to select the next digit position.

With this operation, the flashed display is shifted to the second digit position in the dot matrix display portion *2a*, as shown in FIG. 2C. When the $S_3$ and $S_4$ keys are subsequently operated in the same manner as described above to set character data and numeric data, a name "SUZUKI" is displayed on the dot matrix display portion *2a*, as shown in FIG. 12D, and a telephone number "0123-45-7890" is displayed on the numeric segment display portions *2b* and *2c*, while the numeral "0" at the lowest digit position is flickered.

If the $S_3$ key is operated in this state, "1" is written in the flag register G to set "G=1", and the EEPROM 7 is selected. As a result, as shown in FIG. 12E, the "keep" mark display portion of the LCD 2 is flickered. The flickering "keep" mark "K" indicates that the displayed name/telephone-number data "SUZUKI 0123-45-7890" is stored/kept in the EEPROM 7.

If the $S_4$ key is operation in this state, the "keep" mark "K" disappears. This state indicates that the above-mentioned data is stored in the RAM 6.

If the $S_2$ key is operated in the state shown in FIG. 12E or in the state wherein the "keep" mark "K" disappears, the processing in step A12 is executed to store the name/telephone-number data in the EEPROM 7 or the RAM 6 and edit the data.

The data editing processing in step A12 will be described in detail below with reference to FIG. 7. If the $S_2$ key is operated in the state of "M=1, F=1", the data editing processing in step A12 is executed.

In step B1, newly set data is compared with each data stored in the RAM 6 and the EEPROM 7 to search for the start data of the name data arranged in the alphabetical order.

In step B2, the order data of the start data of the alphabetically arranged name data is set to be "1". In step B3, it is checked whether the start data has the "keep" flag ("1" data). That is, if the input data is the start data, it is checked whether "1" is set in the register G. If the start data is present in the data stored in the EEPROM 7 or the RAM 6, it is checked whether the content of the area CT or DT is "1". If YES in step B3, the flow advances to step B4. If NO in step B3, the flow advances to step B5.

In step B4, the data is stored in the EEPROM 7, and the flow advances to step B6.

If NO in step B3, the flow advances to step B5. In step B5, the data is stored in the RAM 6, and the flow advances to step B6.

In step B6, the address stored in the register $P_0$ or $P_1$ is updated. In step B7, it is checked whether the address designated by each of the registers $P_0$ and $P_1$ is the end address. If YES in step B7, the flow advances to step B8. If NO in step B7, the flow returns to step B1, and steps B1 to B7 are repeated. In this case, in step B2, order data are sequentially added, e.g., order data "2" in the second sequence, and order data "3" in the third sequence. When both the addresses designated by the registers $P_0$ and $P_1$ are end addresses, the flow advances to step BS. In step BS, the registers $P_0$ and $P_1$ are initialized to designate start addresses, respectively.

Subsequently, in step B9, the orders of name/telephone-number data designated by the initialized registers $P_0$ and $P_1$ are compared with each other. That is, the contents of the areas CZ and DZ of registers $C_0$ and $D_0$, which are respectively designated by the registers $P_0$ and $P_1$ are compared with each other, thus checking whether CZ<DZ. If YES in step B9, i.e., the content of the area CZ is smaller (higher in order) than that of the area DZ, the flow advances to step B10. If NO in step B9, i.e., it is determined that the content of the area CZ is larger (lower in order) than that of the area DZ, the flow advances to step B11.

In step B10, "0" is written in the flag register G, and "G=0" is set. As a result, the name/telephone-number data stored in the RAM 6 is selected. After the processing in step B10 is executed, the flow advances to step B12.

In step B11, "1" is written in the flag register G, and "G=1" is set. As a result, the name/telephone-number data stored in the EEPROM 7 is selected. The flow advances from step B11 to step B12.

In step B12, "0" is written in the flag register F to set "M=1, F=0", thus setting the data display mode indicated by "B" in FIG. 11. With the execution of step B12, the processing in FIG. 7 is completed.

Upon completion of the data editing processing in FIG. 7, "AKAO 33-4567 (CZ=1)" and "ENDO 0521-21-1123 (CZ=3)" are stored, as name/telephone-number data, in the TEL data memories $C_0$ to $C_n$ of the RAM 6, and "DOI 03-421-1151 (DZ=2)" and "SUZUKI 0123-45-7890 (DZ=4)" are stored, as name/telephone-number data, in the TEL data memories $D_0$, $D_1$, . . . , as shown in FIG. 4.

The data sequential search processing will be described below with reference to FIG. 8. In this case, since "M=1, F=0, G=0" is set by the data editing processing described above, the name/telephone-number data "AKAO 33-4567" stored in the RAM 6 is displayed on the LCD 2, as shown in FIG. 13A. If the S3 key is operated in this state, the flow advances to step A16 through steps A13 to A15 in FIG. 6, and the data sequential search processing is executed.

In step C1, it is checked whether "G=0" is set, i.e., the content of the flag register G is "0", and the RAM 6 is selected. If YES in step C1, i.e., the RAM 6 is selected, the flow advances to step C2. If NO (G=1) in step C1, i.e., the EEPROM 7 is selected, the flow advances to step C3. In this case, since "G=0" is set, and the name/telephone-number data of the RAM 6 is displayed, the flow advances to step C2.

In step C2, the content of the register $P_0$, which designates an address of the RAM 6, is incremented by one to address-designate the next name/telephone-number data "ENDO 0521-21-1123 (CZ=3)" stored in the RAM 6. The flow then advances from step C2 to step C4.

In step C4, similar to step B9 described above, the orders of the name/telephone-number data designated by the registers $P_0$ and $P_1$ are compared with each other. More specifically, the content "3" of the area CZ and the content "2" of the area DZ respectively designated by the registers $P_0$ and $P_1$ are compared with each other to check whether CZ<DZ. If YES in step C4, i.e., the content of the area CZ is smaller than the content of the area DZ (higher in order), the flow advances to step C5. If NO in step C4, i.e., the content of the area CZ is larger than that content of the area DZ (lower in order), the flow advances to step C6. Since "CZ=3, DZ=2" in this case, NO is obtained in step C4, and the flow advanced to step C6. In step C6, "1" is written in the flag register G to set "G=1", and the EEPROM 7 is selected. With the execution of step C6, the processing in FIG. 8 is completed, and the flow advances to step A5 through step A3 to perform the data display processing.

If NO in step C1, the flow advances to step C3. In step C3, the register $P_1$ for address-designating the EEPROM 7 is incremented by one to address-designate the next data. The flow advances from step C3 to step C4 to check whether CZ<DZ.

If YES in step C4, the flow advances to step C5. In step C5, "0" is written in the; flag register G to set "G=0" and the RAM 6 is selected. With the execution of step C5, the processing in FIG. 8 is completed, and the flow advances to step A5 through step A3 to perform the data display processing.

The data display processing will be described in detail below with reference to FIG. 9. In step D1, it is checked whether "F=0" is set, i.e., the content of the flag register F is "0". If YES in step D1, the flow advances to D2. If NO in step D1, the flow advances to step D5. In this case, since "F=0" is set, YES is obtained in step D1, and the flow advances to step D2.

In step D2, it is checked whether "G=0" is set. If YES in step D2, the flow advances to step D3. If NO in step D2, the flow advances to step D4. In this case, since "G=1" is set, NO is obtained in step D2, and the flow advances to step D4. In step D4, the name/telephone-number data stored in the EEPROM 7 is read out on the basis of the address designated by the register $P_1$. In this case, since the register $P_1$ designates the start address, the name/telephone-number data "DOI 03-421-1151" is displayed together with the "keep" mark "K" on the LCD 2, as shown in FIG. 13B.

If the $S_3$ key is operated again in this state, the data sequential search processing is executed. Since "G=0" is set, NO is obtained in step C1, and the flow advances to step C3. In step C3, the register $P_1$ is incremented by one to address-designate the next name/telephone-number data "SUZUKI 0123-45-7890 (DZ=4)" stored in the EEPROM 7. The flow advances from step C3 to step C4. In step C4, it is checked whether CZ<DZ. Since "CZ=3 and DZ=4", YES is obtained in step C4, and the flow advances to step C5. In step C5, "0" is written in the flag register G to end the processing in FIG. 8, and the data display processing in FIG. 9 is executed.

Referring to FIG. 9 again, since "F=0" is determined in step D1, the flow advances to step D2 to check whether "G=0" is set. Since "G=0" is set, YES is obtained in step D2, and the flow advances to step D3 to read out name/telephone-number data from the RAM 6 in accordance with the address designated by the register $P_0$. In this case, since the register $P_0$ address-designates the name/telephone-number data "ENDO 0521-21-1123 (CZ=3)", the name/telephone-number data "ENDO 0521-21-1123" is displayed on the LCD 2, as shown in FIG. 13C.

If the $S_3$ key is operated in this state, the data sequential search processing is executed. Since "G=0" is set, YES is obtained in step C1, and the flow advances to step C2 to increment the register $P_0$ by one, thus address-designating the next name/telephone-number data ($CZ \geqq 5$) stored in the RAM 6. The flow advances from step C2 to step C4. In step C4, it is checked whether $CZ < DZ$. Since $CZ \geqq 5$, and $DZ = 4$, NO is obtained in step C4, and the flow advances to step C6. In step C6, "1" is written in the flag register G to end the processing in FIG. 8, and the data display processing in FIG. 9 is executed.

Referring to FIG. 9 again, since "F=0" is set in step D1, the flow advances to step D2 to check whether "G=0" is set. In this case, since "G=1" is set, NO is obtained in step D2, and the flow advances to step D4 to read out name/telephone-number data from the EEPROM 7 in accordance with the address designated by the register $P_1$. Since the register $P_1$ designates the name/telephone-number data "SUZUKI 0123-45-7890", the name/telephone-number data "SUZUKI 0123-45-7890" is displayed on the LCD 2 together with the "keep" mark "K", as shown in FIG. 13D.

In this manner, every time the $S_3$ key is operated, a sequential search for name/telephone-number data is performed in the alphabetical order. When the display data is to be transferred to the RAM 6 or the EEPROM 7, the $S_4$ key is operated. With this operation, the data transfer processing in step A19 is executed through steps A17 and A18.

The data transfer processing will be described in detail below with reference to FIG. 10. In step E1, it is checked whether "G=0" is set with respect to displayed data. If YES in step E1, the flow advances to step E2. If NO (G=1) in step E1, the flow advances to step E3. If "G=0" is set, i.e., the display data is data in the RAM 6, step E2 is executed. If "G=1" is set, i.e., the display data is data in the EEPROM 7, step E3 is executed. In step E3,1 "0" is written in the area DT of each of the TEL data memories $D_0$, $D_1$, . . . respectively address-designated by the register $P_1$, and the flow advances to step E4 to perform the data 10 editing processing.

In step E4, similar to step A12, the name/telephone-number data is ranked and stored in the RAM 6 or the EEPROM 7 depending on whether the "keep" flag "1" is written in the area CT or DT. In this case, if the $S_4$ key is operated while the name/telephone-number data "SUZUKI 0123-45-7890" in the EEPROM 7 is displayed, since "0" is written in the area DT, this name/telephone-number data is stored in the RAM 6. After step E4 is executed, the processing in FIG. 10 is completed, and the flow advances to the data display processing sequence.

Figure 14:
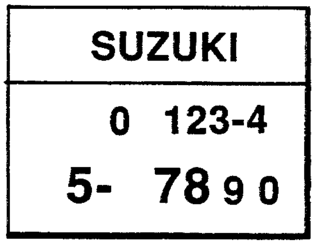

In the data display processing, as shown in FIG. 14, the displayed "keep" mark "K" disappears, and only the name/telephone-number data "SUZUKI 0123-45-7890" is displayed on the LCD 2.

If "G=0", i.e., YES in step E1, the flow advances to step E2 to write the "keep" flag "1" in the area CT of each of the TEL data memories $C_0$ to $C_n$ address-designated by the register $P_0$, and the flow advances to step E4 to perform data editing processing. Since the name/telephone-number data is ranked, and the "keep" flag "1" is written in the area CT, the name/telephone-number data is stored in the EEPROM 7.

[Second Embodiment]

The second embodiment of the present invention will be described below with reference to FIGS. 15 and 16. In the second embodiment, a data storage apparatus is designed to store schedule data in a RAM 6 and an EEPROM 7 in addition to name/telephone-number data. Each schedule data consists of schedule type data (e.g., "MEETING" ) and schedule time data (e.g., December 15, 10:30 am).

Schedule data stored in the RAM 6 and the EEPROM 7 are sequentially edited in the data editing processing in FIG. 7 in the order of schedule time closer to the current time.

Figure 6:
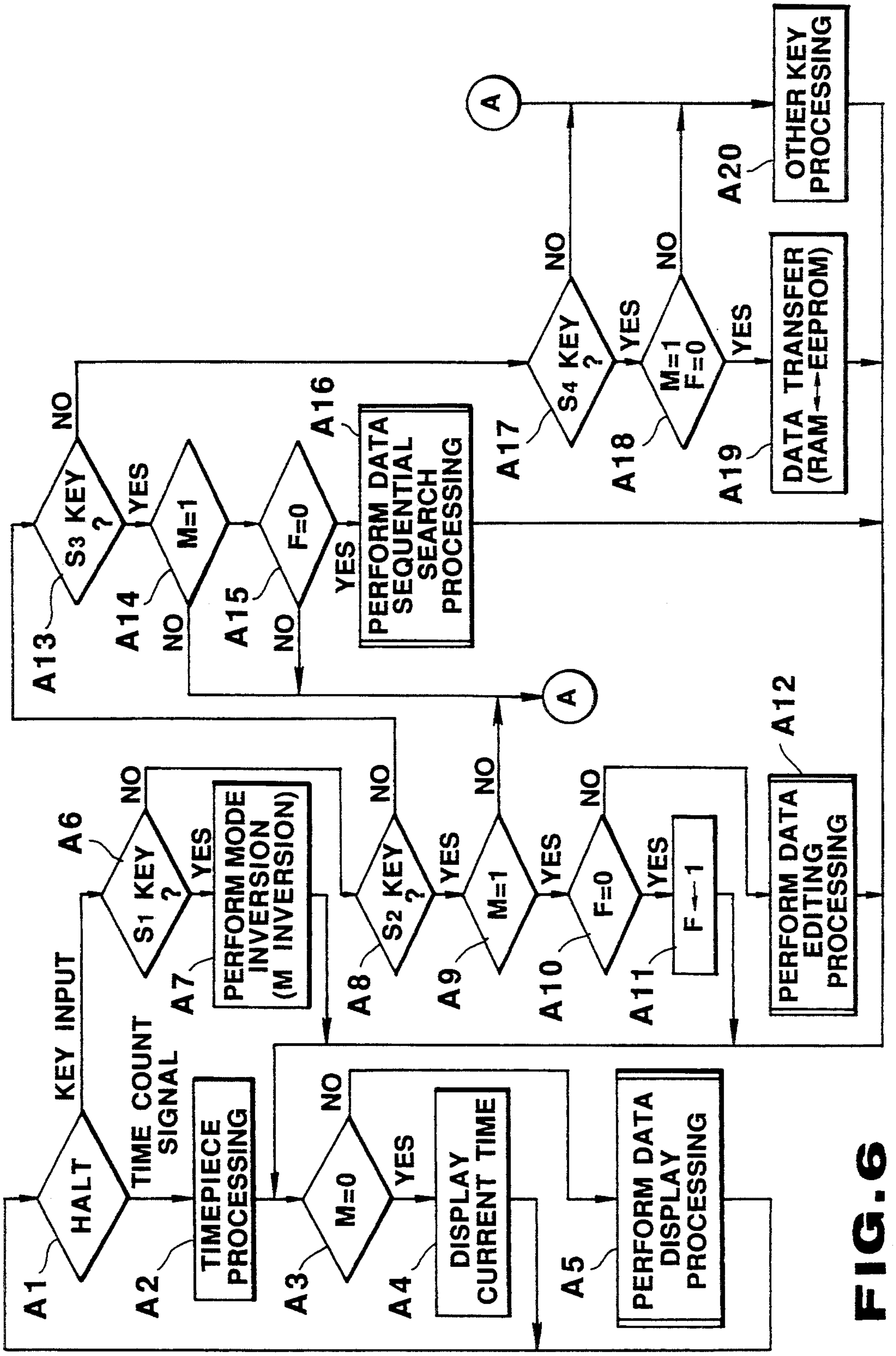
Figure 15:
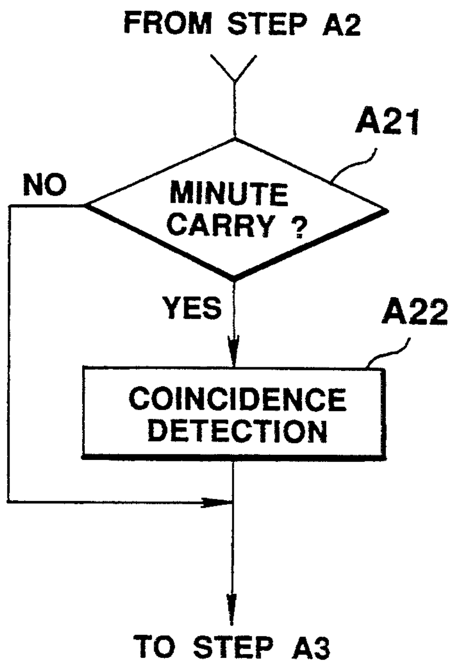
FIGS. 15 and 16 are flow charts showing operations in the second embodiment of the present invention.

FIG. 15 shows steps to be added between steps A2 and A3 in FIG. 6. More specifically, in the second embodiment, after the timepiece processing in step A2 is executed, the flow advances to step A21. In step A21, it is checked whether a minute carry is present, i.e., the minute data of the current time is updated. In step A22, coincidence detection processing is executed to detect whether schedule time coincides with the current time. This coincidence detection processing will be described in detail below with reference to FIG. 16.

In step F1, it is checked whether "G=0" is set. If YES in step F1, the flow advances to step F2. If NO (G=1) in step F1, the flow advances to step F8.

In step F2, it is checked whether the schedule time data in the RAM 6 designated by the register $P_0$ coincides with the current time. If YES in step F2, the flow advances to step F3. If NO in step F2, the processing in FIG. 16 is ended.

If YES in step F2, the flow advances to step F3 to increment the content of the register $P_0$ by one. In alarm processing in step F4, an alarm sound is generated to inform the arrival of the schedule time.

In step F5, the schedule time data respectively designated by the registers $P_0$ and $P_1$ are compared with each other to check whether the schedule time data designated by the register $P_0$ is closer in time to the current time than the schedule time data designated by the register $P_1$. If YES in F5, the flow advances to step F6. If NO in step F5, the flow advances to step F7.

If YES in step F5, the flow advances to step F6 to write "0" in the flag register G, and the processing in FIG. 16 is ended. If NO in step F5, the flow advances to step F7 to write "1" in the flag register G, and the processing in FIG. 16 is ended.

If NO in step F1, the flow advances to step F8 to check whether the schedule time data in the EEPROM 7 designated by the register $P_1$ coincides with the current time data. If YES in step F8, the flow advances to step F9. If NO in step, the processing in FIG. 16 is ended.

If YES in step F8, the flow advances to step F9 to increment the content of the register $P_1$ by one. As a result, the next schedule data is designated, and the flow advances to step F4. Subsequently, the processing in steps F4 to F7 is executed in the same manner as described above.

[Third Embodiment]

Figure 17:
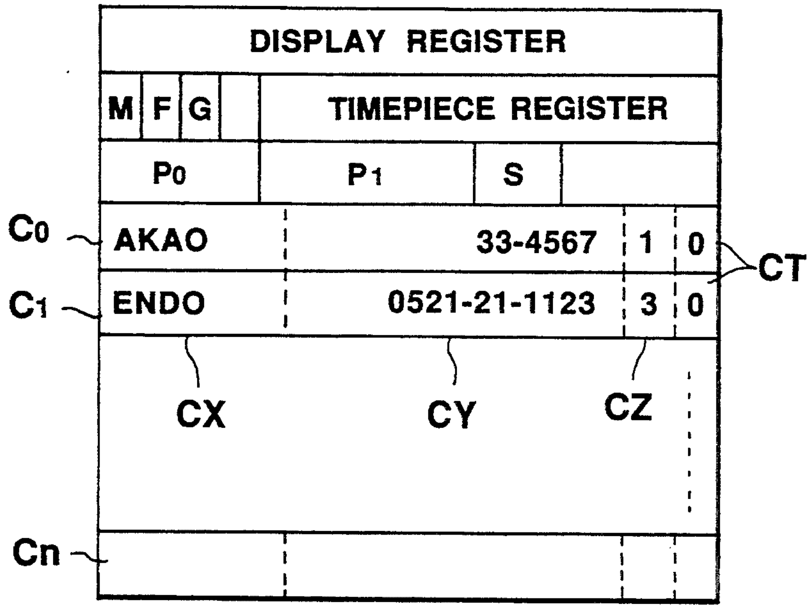
Figure 18:
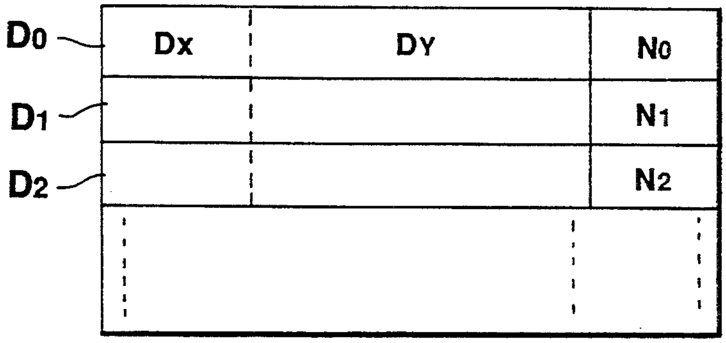

FIGS. 17 to 21 show the third embodiment of the present invention. This embodiment exemplifies a case wherein the data write count limit of an EEPROM is exceeded. FIG. 17 shows a RAM used in place of the RAM 6 in FIG. 4, to which a register S is added. FIG. 18 shows an EEPROM, in which registers N0, N1, N2, . . . for storing a data write count are respectively arranged in registers D0, D1, D2, . . . .

Figure 19:
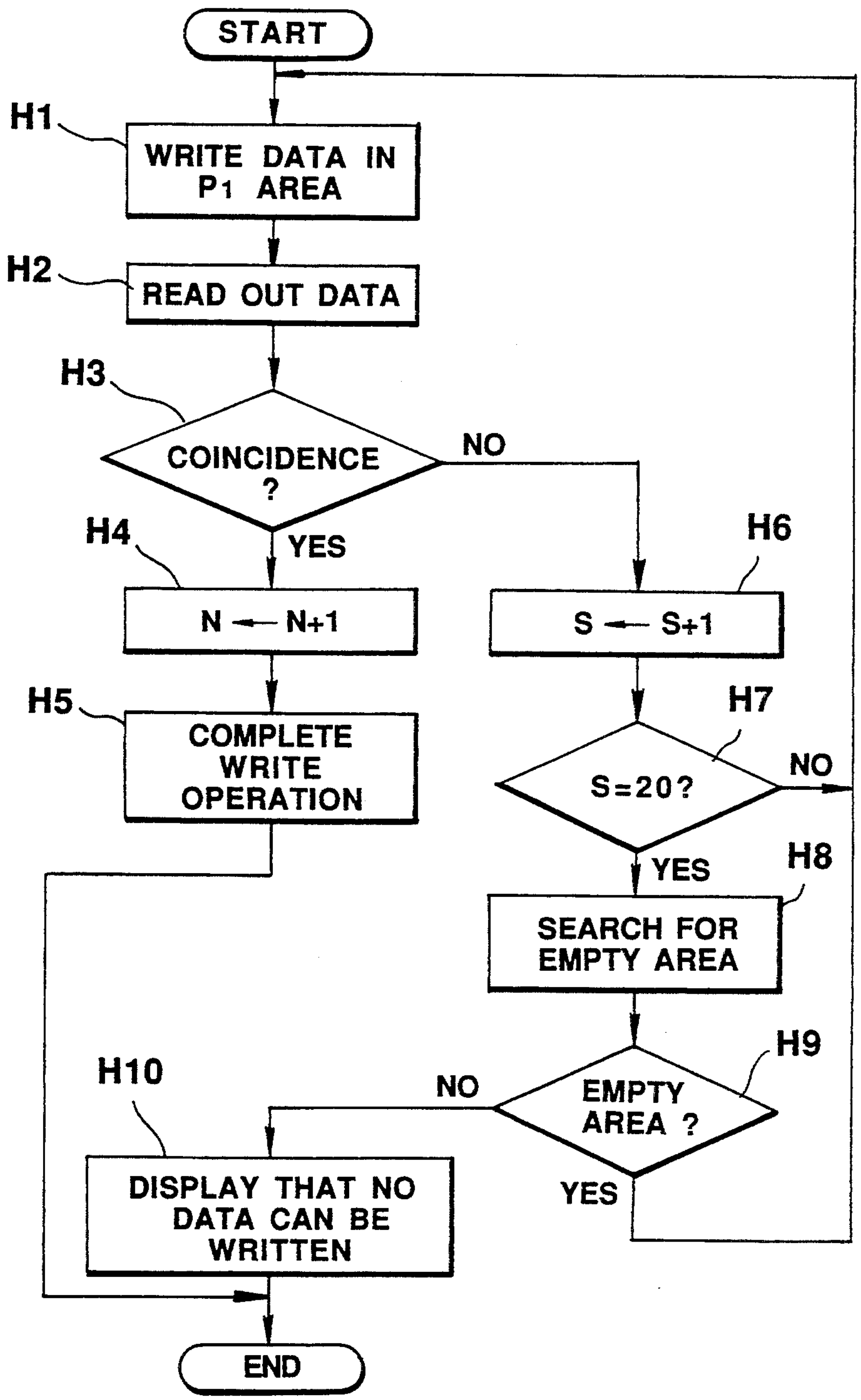

FIG. 19 is a flow chart showing the process of writing data in the EEPROM. In step H1, input data is written in a memory area designated by a pointer $P_1$ of a RAM 6. In step H2, the data in the memory area is read out. In step H3, it is checked whether the written data coincides with the read data.

When the two data coincide with each other, it means that the write operation is properly performed. In this case, in step H4, the value of a register N for storing a data write count with respect to the memory area is incremented. In step H5, an R mark display element 20 is displayed to end the data write operation.

If the written data and the read data do not coincide with each other, the flow advances to step H6 to increment the value of a register S for storing a data write repetition count. Furthermore, in step H7, it is checked whether the value of the register S has reached "20".

If the data write repetition count is less than 20, the flow returns to step H1 to write data in the designated memory area again.

If the data cannot be written after data write operations with respect to the same memory area are repeated 20 or more times, it is determined that the data write count limit of the memory area is exceeded, and no more data can be written there. In step H8, a search for an empty area is performed. In step H9, it is checked whether any empty area is present.

If YES in step H9, the flow returns to step H1 to write the data in the empty area.

If NO in step H9, the flow advances to step H10 to display that no data can be written.

Figure 20:
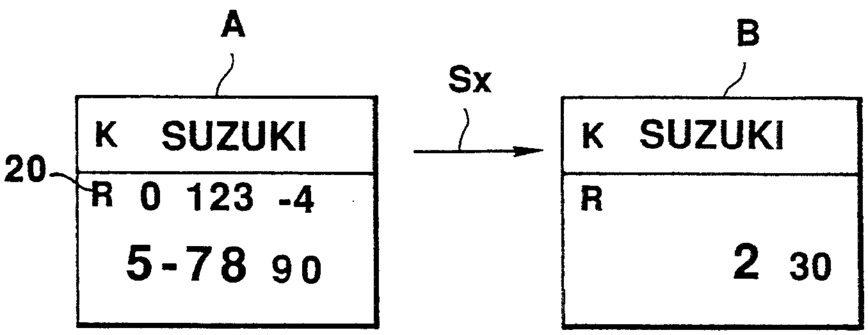

"A" in FIG. 20 shows a display state of data. Referring to FIG. 20, when data is written in the memory area designated by the pointer $P_1$, the R mark display element 20 is turned on in step H5 to inform a user that the data write operation is completed.

Figure 21:
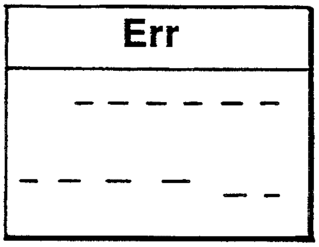

If the data cannot be written in the designated memory area, and there are no other memory areas in which the data can be written, "Err" is displayed in step H10, as shown in FIG. 21.

Note that data write count data in each of the registers N0, N1, N2, . . . for storing a data write count with respect to the EEPROM may be displayed upon switch operation. For example, when an SX key (not shown) is operated in the state indicated by "A" of FIG. 20, a data write count of 230 with respect to the displayed area may be displayed, as indicated by "B" in FIG. 20.

In the above-described embodiments, name/telephone-number data and schedule data are input by operating the switches as input means. However, a terminal for communicating with an external unit may be arranged to receive data through this terminal in accordance with a predetermined format, e.g., the standards RS-232c or the like. Alternatively, in a paper or the like, an antenna and a radio circuit may be arranged as input means to receive data through radio signals.

In each embodiment described above, an electronic wristwatch for storing data is exemplified. However, the present invention is not limited to the wristwatch but may be applied to other devices such as an electronic notebook, an IC card, and a wordprocessor.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A data storage apparatus comprising:
 data input means for inputting data;
 volatile memory means capable of storing the data input by said data input means;
 nonvolatile memory means capable of storing the data input by said data input means;
 selection switch means for selecting one of said volatile memory means and said nonvolatile memory means in which the data input by said data input means is stored;
 storage control means for causing the memory means selected by said selection switch means to store the data input by said data input means;
 display means for reading out the data stored in one of said volatile and nonvolatile memory means, and for displaying the read-out data;
 indication means for indicating whether the data displayed by said display means is stored in said volatile or nonvolatile memory means;
 transfer means for transferring the data which is displayed by said display means and which is stored in said one of said volatile memory means and said nonvolatile memory means to another one of said volatile memory means and said nonvolatile memory means;
 count means for counting a number of times that the data is stored in said nonvolatile memory means; and
 storage count display means for displaying a number of storage operations counted by said count means.

2. An apparatus according to claim 1, wherein said volatile memory means includes a RAM, and said nonvolatile memory means includes an EEPROM.

3. An apparatus according to claim 1, wherein said display means comprises first display means for displaying the data stored in said volatile memory means, and second display means for displaying the data stored in said nonvolatile memory means.

4. An apparatus according to claim 1, further comprising alarm means for informing whether the data is stored in said nonvolatile memory means by said storage control means.

5. An apparatus according to claim 1, further comprising a battery power supply, and a power supply circuit for applying different driving voltages to said volatile memory means and said nonvolatile memory means in accordance with an output voltage from said battery power supply.

6. An apparatus according to claim 1, further comprising a timepiece circuit for obtaining time information by counting reference signals, and time display means for displaying the time information obtained by said timepiece circuit.

7. An apparatus according to claim 1, wherein said data storage apparatus is incorporated in a case of a wristwatch type device worn on a wrist of a user.

8. An apparatus according to claim 1, wherein said indication means includes means for visually indicating whether the data displayed by said display means is stored in said volatile memory means or said nonvolatile memory means.

9. A data storage apparatus comprising:
 data input means for inputting data;
 volatile memory means capable of storing the data input by said data input means;

nonvolatile memory means capable of storing the data input by said data input means;

selection switch means for selecting one of said volatile memory means and said nonvolatile memory means in which the data input by said data input means is stored;

storage control means for causing the memory means selected by said selection switch means to store the data input by said data input means;

adding means for adding order data to each data stored by said storage control means, said order data following a predetermined order;

data display means for sequentially displaying the data stored in said volatile memory means and said nonvolatile memory means in accordance with the order data added by said adding means;

indication means for indicating whether the data displayed by said data display means is stored in said volatile memory means or said nonvolatile memory means;

transfer means for transferring the data which is displayed by said data display means and which is stored in one of said volatile memory means and said nonvolatile memory means to another one of said volatile memory means and said nonvolatile memory means;

count means for counting a number of times that the data is stored in said nonvolatile memory means; and storage count display means for displaying a number of storage operations counted by said count means.

10. An apparatus according to claim 9, wherein said volatile memory means includes a RAM, and said nonvolatile memory means includes an EEPROM.

11. An apparatus according to claim 9, further comprising alarm means for informing whether the data is stored in said nonvolatile memory means by said storage control means.

12. An apparatus according to claim 9, further comprising a battery power supply, and a power supply circuit for applying different driving voltages to said volatile memory means and said nonvolatile memory means in accordance with an output voltage from said battery power supply.

13. An apparatus according to claim 9, further comprising a timepiece circuit for obtaining time information by counting reference signals, and time display means for displaying the time information obtained by said timepiece circuit.

14. An apparatus according to claim 9, wherein said data storage apparatus is incorporated in a case of a wristwatch type device worn on a wrist of a user.

15. An apparatus according to claim 9, wherein said indication means includes means for visually indicating whether the data displayed by said display means is stored in said volatile memory means or said nonvolatile memory means.

16. A data storage apparatus comprising:

data input means for inputting data;

volatile memory means capable of storing the data input by said data input means;

nonvolatile memory means capable of storing the data input by said data input means;

selection switch means for selecting one of said volatile memory means and said nonvolatile memory means in which the data input by said data input means is stored;

storage control means for causing the memory means selected by said selection switch means to store the data input by said data input means;

display means for reading out the data stored in one of said volatile and nonvolatile memory means, and for displaying the read-out data;

indication means for indicating whether the data displayed by said display means is stored in said volatile or nonvolatile memory means; and transfer means for transferring the data which is displayed by said display means and which is stored in said one of said volatile memory means and said nonvolatile memory means to another one of said volatile memory means and said nonvolatile memory means;

wherein said transfer means includes a manually operable member for manually operating said transfer means to cause transferring of data from one of said volatile memory means and nonvolatile memory means to another one of said volatile memory means and nonvolatile memory means.

17. An apparatus according to claim 16, wherein said volatile memory means includes a RAM, and said nonvolatile memory means includes an EEPROM.

18. An apparatus according to claim 16, wherein said display means includes first display means for displaying one by one the data stored in said volatile memory means, and second display means for displaying one by one the data stored in said nonvolatile memory means.

19. An apparatus according to claim 16, further comprising alarm means for informing whether the data is stored in said nonvolatile memory means by said storage control means.

20. An apparatus according to claim 16, further comprising a battery power supply, and a power supply circuit for applying different driving voltages to said volatile memory means and said nonvolatile memory means in accordance with an output voltage from said battery power supply.

21. An apparatus according to claim 16, further comprising a timepiece circuit for obtaining time information by counting reference signals, and time display means for displaying the time information obtained by said timepiece circuit.

22. An apparatus according to claim 16, wherein said data storage apparatus is incorporated in a case of a wristwatch type device worn on a wrist of a user.

23. A data storage apparatus comprising:

data input means for inputting data;

volatile memory means capable of storing the data input by said data input means;

nonvolatile memory means capable of storing the data input by said data input means;

selection switch means for selecting one of said volatile memory means and said nonvolatile memory means in which the data input by said data input means is stored;

storage control means for causing the memory means selected by said selection switch means to store the data input by said data input means;

adding means for adding order data to each data stored by said storage control means, said order data following a predetermined order;

data display means for sequentially displaying the data stored in said volatile memory means and said nonvolatile memory means in accordance with the order data added by said adding means;

indication means for indicating whether the data displayed by said data display means is stored in said volatile memory means or said nonvolatile memory means;

transfer means for transferring the data which is displayed by said data display means and which is stored in one of said volatile memory means and said nonvolatile memory means to another one of said volatile memory means and said nonvolatile memory means;

wherein said transfer means includes a manually operable member for manually operating said transfer means to cause transferring of data from one of said volatile memory means and nonvolatile memory means to another one of said volatile memory means and nonvolatile memory means.

24. An apparatus according to claim 23, wherein said volatile memory means includes a RAM, and said nonvolatile memory means includes an EEPROM.

25. An apparatus according to claim 23, further comprising alarm means for informing whether the data is stored in said nonvolatile memory means by said storage control means.

26. An apparatus according to claim 23, further comprising a battery power supply, and a power supply circuit for applying different driving voltages to said volatile memory means and said nonvolatile memory means in accordance with an output voltage from said battery power supply.

27. An apparatus according to claim 23, further comprising a timepiece circuit for obtaining time information by counting reference signals, and time display means for displaying the time information obtained by said timepiece circuit.

28. An apparatus according to claim 23, wherein said data storage apparatus is incorporated in a case of a wristwatch type device worn on a wrist of a user.

* * * * *